United States Patent [19]

Toda et al.

[11] Patent Number: 4,608,316

[45] Date of Patent: Aug. 26, 1986

[54] CERAMIC WIRING BOARD AND PROCESS FOR PRODUCING THE SAME

[75] Inventors: Gyozo Toda, Hino; Tsuyoshi Fujita, Yokohama; Hiromi Tosaki, Yokohama; Takashi Kuroki, Yokohama, all of Japan

[73] Assignee: Hitachi, Ltd., Tokyo, Japan

[21] Appl. No.: 776,879

[22] Filed: Sep. 17, 1985

[30] Foreign Application Priority Data

Oct. 1, 1984 [JP] Japan ............................ 59-204163

[51] Int. Cl.$^4$ ........................................... B32B 9/00
[52] U.S. Cl. ........................................ 428/446; 264/56; 264/61; 264/66; 428/210; 428/901
[58] Field of Search ............................ 264/56, 61, 66; 428/446, 315.5, 315.7, 901, 131, 137, 209, 210

[56] References Cited

U.S. PATENT DOCUMENTS

| | | | |
|---|---|---|---|
| 4,299,873 | 11/1981 | Ogihara et al. | 428/210 |
| 4,387,131 | 6/1983 | Anderson et al. | 423/210 |
| 4,418,025 | 11/1983 | Prochazka | 264/63 |
| 4,465,727 | 8/1984 | Fujita et al. | 428/901 |

*Primary Examiner*—William J. Van Balen
*Attorney, Agent, or Firm*—Antonelli, Terry & Wands

[57] ABSTRACT

A ceramic wiring board comprising a silica board having pores of several ten to several hundred Å in diameter amounting to 5 to 20 vol % of the insulating layer, and a process for producing the same, which comprises heat-treating a silicon alkoxide to form a fine silica powder and sintering the fine powder. This board has good mechanical characteristics and a high signal propagation speed.

5 Claims, 2 Drawing Figures

CERAMIC WIRING BOARD AND PROCESS FOR PRODUCING THE SAME

BACKGROUND OF THE INVENTION

The present invention relates to a ceramic wiring board. Particularly, this invention relates to a ceramic board having a low dielectric constant, which can be favorably employed as a circuit wiring board in an electronic computer, etc.

It is known that the propagation speed of an electric signal in a circuit wiring board, etc. is, in general, closely related to the length $l$ of a metal for wiring conductor and the capacity $C$ of an insulating wiring layer. The capacity $C$ is substantially proportional to the dielectric constant $\epsilon$ of the insulating layer. Thus, the lower the dielectric constant, the higher the electric signal propagation speed in the wiring board. More specifically, the signal propagation speed is inversely proportional to the square root of the dielectric constant $\epsilon$.

In general, it is required that the electric signal propagation speed be as high as possible. Thus, a substance having a low dielectric constant is currently desired as the wiring board material. Particularly in the field of large electronic computers where a higher speed is very earnestly demanded, a decrease in the dielectric constant of a ceramic board for mounting parts thereon is eagerly desired.

Organic substances such as resins were employed as wiring board materials of old. Since, however, they are poor in reliability, ceramics such as alumina have recently been employed. However, the dielectric constant of alumina ($Al_2O_3$) is about 9, which is unsuitable for the above-mentioned requirement of a low dielectric constant. In view of this, intensive investigations have been made on application of materials having a lower dielectric constant than that of $Al_2O_3$ to wiring boards. Examples of such materials include mullite ceramics (dielectric constant: 6 to 7) and glass ceramics (dielectric constant: 5 to 6). Although the dielectric constants of these materials are lower than that of $Al_2O_3$, they are yet insufficient as those of high-speed propagation board materials.

The material having the lowest dielectric constant among ceramics is silica ($SiO_2$) (dielectric constant: about 4). Thus, if silica is used, a wiring board capable of high-speed propagation of signals can be expected. However, in realizing a further improvement in the performance of a board, $SiO_2$ itself has limitations in achieving a low dielectric constant. Thus another measure must be taken for realizing a lower dielectric constant.

SUMMARY OF THE INVENTION

An object of this invention is to provide a wiring board having a high signal propagation speed with the use of a board made of a material having a low dielectric constant, which overcomes the disadvantages of the prior art as described above. Another object of this invention is to provide a process for producing a wiring board of the kind as described above.

To attain the above-mentioned objects, the ceramic wiring board of the present invention comprises an insulating layer of silica having pores therein, and a conductor layer formed on said insulating layer and having a predetermined pattern. The conductor layer may be either a single layer or a multiple layer. In the latter case, insulating and conductor layers are alternately laminated.

The pore volume is desired to amount to 5 to 20 vol % of the insulating layer. It is desired that the shape of pores be substantially spherical, and that the size of pores be 50 to 800 Å. When the pore volume is less than 5 vol %, a decrease in the dielectric constant is not sufficient. When the pore volume exceeds 20 vol %, the mechanical strength lowers. Thus, neither case is favorable. When the shape of pores is not spherical (the term "spherical" means that there are no pores of any angular shape), the mechanical strength is unfavorably low. With a pore size of less than 50Å, it is difficult to control the pore diameter and the pore volume. With a pore size exceeding 800 Å, the mechanical strength lowers. Thus, neither case is favorable.

The present invention is based on an idea that a combination of $SiO_2$ having the lowest dielectric constant among inorganic materials with pores provides a material having a lower dielectric constant than that of $SiO_2$ itself.

It is generally known that air has the lowest dielectric constant of 1. Therefore, a combination of $SiO_2$ having the low dielectric constant as described above with air provides an expectation that the dielectric constant of $SiO_2$ may be further lowered. For realizing this, formation of pores in $SiO_2$ will suffice. For example, a material having a fine structure having a large number of micropores dispersed in $SiO_2$ has only to be employed. The relationship between the pore volume and the dielectric constant in the presence of pores in dense ceramics is reported in relation to mullite ceramics by G. S. Perry in the Transaction of British Ceramic Society, vol. 72 (1973), page 279. According to the report, incorporation of about 10% of pores into mullite having a dielectric constant of 7 decreases the dielectric constant to about 6. The extent of this decrease corresponds to about 14% that of the original mullite.

Formation of pores in ceramics is a very effective method for decreasing the dielectric constant as described above. Nevertheless, a technique of pore formation in $SiO_2$ has never been conceived heretofore. This is believed to be because there has been the following technical bottleneck. Specifically, the presence of pores in ceramics decreases the mechanical strength of the ceramics. This is believed to have blocked a conception of the technique of pore formation in $SiO_2$. Factors influential on the strength include the volume, size, and shape of the pore. Particularly, the latter two are known to have great influences. Moreover, no method of producing an $SiO_2$ material having pores formed therein has yet been studied. Furthermore, the technique of forming pores with desired properties has never been known.

According to the present invention, which has overcome the above-mentioned difficulties, success has been achieved in development of a technique allowing pores to be formed in an $SiO_2$ material with desired properties of the pores, for example, with a very small diameter of substantially spherical pores and, hence, development of a board material having a low dielectric constant with a minimized decrease in the strength.

The process for preparing a material having such a structure may comprise heat-treating a metal alkoxide as the starting material to form a fine powder of an oxide, forming the powder into a sheet, and sintering the sheet. The powder obtained by decomposition of the metal alkoxide is very fine, rich in reactivity, and excellent in sinterability. Desired pore size and shape can be obtained by variously controlling the sintering conditions.

In sintering the sheet formed from a silica powder prepared from a silicon alkoxide, preferred sintering conditions include a heating rate of 50° to 200° C./h, a sintering temperature of 1,100° to 1,300° C., and a time required for keeping the sintering temperature of 20 to 300 minutes. A heating rate of lower than 50° C./h unfavorably provides an insufficient effect of this invention and a poor practicability, while a heating rate exceeding 200° C./h unfavorably provides large pores grown from closed pores formed in the course of sintering. A sintering temperature of lower than 1,100° C. provides an unfavorable tendency to leave pores with an angular shape intact, leading to a decrease in the mechanical strength of the ceramic board, while a sintering temperature exceeding 1,300° C. unfavorably provides a pore volume of less than 5 vol % and a poor controllability of the pore volume. The time required for keeping the sintering temperature is shortened when the sintering temperature is high, and lengthened when the sintering temperature is low. When sintering is effected at a high temperature for a long time, the pore volume is less than 5 vol %. When sintering is effected at a low temperature for a short time, the mechanical strength of the ceramic board is lowered. A preferred shortest sintering time at a sintering temperature of about 1,300° C. is about 20 minutes. A sintering time exceeding 300 minutes within the above-mentioned range of the sintering temperature reduces the effect of this invention.

Incidentally, the process for preparing a silica powder from a silicon alkoxide is well known. In general, the structure of a wiring board having a conductor layer formed on an insulating layer is widely used. The process for forming a conductor layer on an insulating layer is well known.

DESCRIPTION OF THE PREFERRED EMBODIMENTS

The following Examples will further illustrate the present invention.

EXAMPLE 1

As is well known, when water ($H_2O$) and ammonia ($NH_3$) for pH adjustment is added to silicon isopropoxide $Si(OC_3H_7)_4$ as the starting material, a hydroxide is formed according to the following reaction:

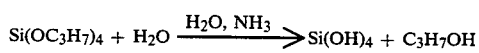

When the hydroxide $Si(OH)_4$ thus formed is heated in vacuo, an $SiO_2$ powder is formed according to the following reaction, as is known:

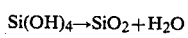

In this Example, an $SiO_2$ powder was prepared according to the above-mentioned process. The temperature of heating $Si(OH)_4$ in vacuo was 60° C.

This $SiO_2$ having a particle size of 50 to 800 Å on the average was used as the raw material of a board. The particle size is dependent on the temperature of heating in vacuo. The higher the temperature, the larger the particle size with a tendency of agglomeration of the powder. Particularly, the agglomeration is not desired since it provides nonuniform sheet characteristics when the powder is formed into a sheet.

As described above, the average particle size of the $SiO_2$ powder is preferably 50 to 800 Å in the present invention. A preferred temperature of heating $Si(OH)_4$ in obtaining an appropriate particle size of the $SiO_2$ powder as mentioned above is in a range of 50° to 120° C.

Subsequently, the fine $SiO_2$ powder is formed into a sheet by the customary doctor blade method or the like. At this time, an organic binder such as polyvinyl butyral (PVB) is employed for mutual binding of $SiO_2$ particles. The amount of PVB added is 5 to 10 wt. %. In addition, an adequate amount of a plasticizer, for example, 2 to 5 wt. % of an ester of phthalic acid, and/or a solvent, for example, 35 to 60 wt. % of trichloroethylene, are added thereto to form a slip of the $SiO_2$ powder. A sheet having a thickness of 100 to 150 μm was prepared from the slip by casting. In this case, since the $SiO_2$ powder is very fine, the dispersion thereof in the organic substances must be made very good. In order to attain uniform dispersion, a small amount of a dispersant such as a silane coupling agent (0.2 to 0.5 wt. % in this case) is preferably added to the slip, followed by sufficient mixing in a ball mill or the like. When the $SiO_2$ sheet thus obtained is heated at 1,000° to 1,300° C., the organic substances contained in the $SiO_2$ sheet are decomposed and removed at the early stage of heating, for example, at the temperature lower than 500° C., and, subsequently, sintering of the $SiO_2$ powder begins.

Figure 1:
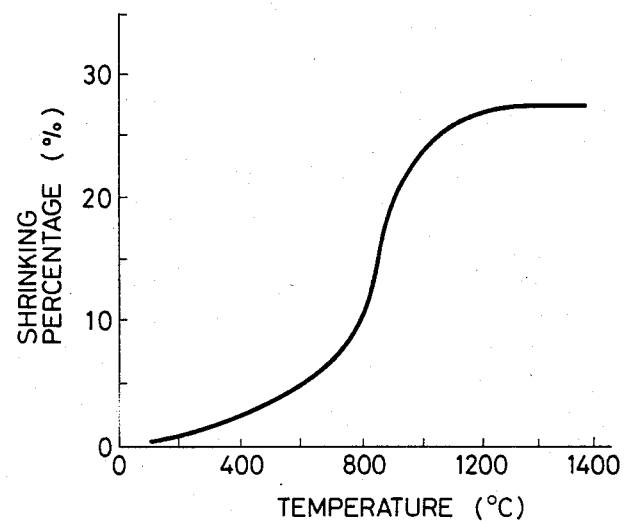
FIG. 1 shows a shrinkage curve of an $SiO_2$ sheet during heating.

FIG. 1 shows the progress of shrinkage when the $SiO_2$ sheet is heated. The shrinkage progresses with an increasing temperature and shows a tendency of substantial saturation from around 1,200° C.

With the progressing shrinkage, the pore volume in the $SiO_2$ sheet decreases. The pore volume is dependent on not only the sintering temperature but also the heating rate and the time of keeping the sintering temperature, which affect the size and shape of pores, too. The higher the temperature and the lower the heating rate, the smaller the pore diameter, which is, however, most affected by the sintering temperature.

When sintering was effected at a heating rate of 150° C./h at a sintering temperature of 1200° C. for a sintering time of 1 hour, the porosity in the $SiO_2$ sheet was about 12%, the average pore diameter was 650 Å, and the pore shape was substantially spherical without pores with an angular shape.

The resulting sheet had a dielectric constant of 3.4, which is far lower than that of alumina, and a transverse rupture strength of 1,500 kg/cm2, which is a substantially satisfactory value as that of a board. Incidentally, the transverse rupture strength necessary for a wiring board is usually about 1,000 Kg/cm2 or more.

When the heating rate is 400° C./h, pores of the order of several μm in diameter are present. When the sintering temperature is 1,000° C. or lower, the shape of the pores is angular. There is a possibility that such pores in either case afford stress concentrating portions when stress is applied to the board, leading to a decrease in the strength of the board.

Figure 2:
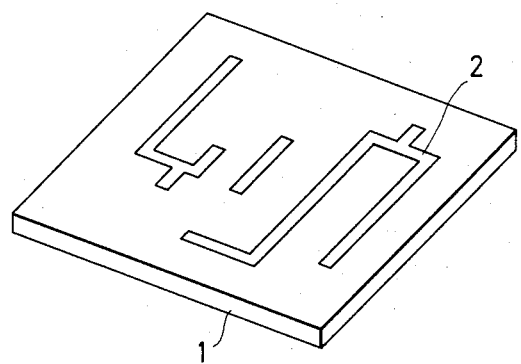
FIG. 2 is a perspective view of a ceramic wiring board according to one embodiment of this invention.

An Al layer having a thickness of 2 μm was deposited in vacuo on the ceramic board thus prepared, and formed into a predetermined pattern by the well-known photoetching method to obtain a ceramic wiring board. FIG. 2 is a perspective view of the ceramic wiring board thus obtained, which is composed of a ceramic board 1 of the porous $SiO_2$ sheet and a conductor layer 2.

EXAMPLE 2

A $SiO_2$ sheet was prepared in the same manner as in Example 1. 12 pieces of this sheet were heat-pressed to prepare a sheet having a thickness of about 1.5 mm. This thick sheet was heated to 1,100° C. at a rate of 100° C./h and kept at 1,100° C. for 3 hours, followed by cooling. Subsequently, the characteristics were examined. The dielectric constant was 3.2 and the transverse rupture strength was 1,300 Kg/cm². The lower dielectric constant and lower transverse rupture strength than those in Example 1 were due to the lower sintering temperature. The porosity in the sintered $SiO_2$ was about 18%, and the average pore diameter was 120 Å. The shape of the pores was substantially spherical. A predetermined pattern of a conductor layer was formed on the ceramic board thus prepared in the same manner as in Example 1 to produce a ceramic wiring board according to the present invention.

EXAMPLE 3

A $SiO_2$ sheet was prepared in the same manner as in Example 1. 30 pieces of this sheet were heat-pressed to prepare a sheet having a thickness of about 3.5 mm. The sheet thus prepared was heated to a sintering temperature of 1,300° C. at a rate of 200° C./h and kept at that temperature for 20 minutes. The resulting sinter had a porosity of about 5%, an average pore diameter of 85 Å, a dielectric constant of 3.7, and a transverse rupture strength of 1,700 Kg/cm².

A predetermined pattern of a conductor layer was formed on the ceramic board thus obtained in the same manner as in Example 1 to produce a ceramic wiring board.

As described hereinbefore, the ceramic wiring board of this invention includes a ceramic board comprising an $SiO_2$ material having micropores. Thus the insulating layer of the board could have a lower dielectric constant, thus enabling a wiring board having a very high signal propagation speed to be obtained.

The process for producing a ceramic wiring board according to the present invention involves the use of a metal alkoxide in the preparation of an $SiO_2$ board. This enables a board having desired properties to be easily obtained. However, needless to say, a ceramic wiring board according to the present invention which is produced using a raw material for formation of a fine powder, such as $SiCl_4$, other than the metal alkoxide, and/or which involves the preparation of a sheet according to the sol-gel method, the spinner method, or the like can exhibit the effect of this invention in the same way, too.

Incidentally, in the ceramic wiring board and the method of producing the same of the present invention, conventional knowledges and known teachings may be adopted in connection with matters not specifically described in the instant specification.

What is claimed is:

1. A ceramic wiring board comprising an insulating layer made of silica and having pores in said silica.

2. A ceramic wiring board as claimed in claim 1, wherein the pore volume amounts to 5 to 20 vol % of said insulating layer.

3. A ceramic wiring board as claimed in claim 2, wherein the average pore diameter is 50 to 800 Å.

4. A ceramic wiring board as claimed in claim 3, wherein the pore shape is substantially spherical.

5. A process for producing a ceramic wiring board, comprising the steps of heat-treating a silicon alkoxide to form a fine silica powder, and sintering said fine silica powder to form an insulating layer having pores in the silica.

* * * * *